(12) United States Patent
Lee et al.

(10) Patent No.: US 9,082,478 B2
(45) Date of Patent: Jul. 14, 2015

(54) NONVOLATILE MEMORY DEVICE USING RESISTANCE MATERIAL AND METHOD OF DRIVING THE NONVOLATILE MEMORY DEVICE

(71) Applicant: Samsung Electronics Co., Ltd., Suwon-si (KR)

(72) Inventors: Sung-Yeon Lee, Seoul (KR); Yeong-Taek Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 27 days.

(21) Appl. No.: 13/940,856

(22) Filed: Jul. 12, 2013

(65) Prior Publication Data
US 2014/0119094 A1 May 1, 2014

(30) Foreign Application Priority Data
Oct. 29, 2012 (KR) .......................... 10-2012-0120536

(51) Int. Cl.
*G11C 13/00* (2006.01)
*G11C 11/16* (2006.01)
*G11C 11/56* (2006.01)

(52) U.S. Cl.
CPC .......... *G11C 13/004* (2013.01); *G11C 11/5678* (2013.01); *G11C 11/5685* (2013.01); *G11C 11/16* (2013.01); *G11C 11/5607* (2013.01); *G11C 13/0004* (2013.01); *G11C 13/0007* (2013.01); *G11C 2213/71* (2013.01); *G11C 2213/72* (2013.01)

(58) Field of Classification Search
CPC ................................. G11C 11/14; G11C 11/00
USPC ............... 365/148, 185, 189.1, 163, 209, 205
See application file for complete search history.

(56) References Cited

U.S. PATENT DOCUMENTS

| | | | |
|---|---|---|---|
| 6,282,133 B1 | 8/2001 | Nakagawa et al. | |
| 6,870,785 B1 | 3/2005 | Kang | |
| 7,580,297 B2 | 8/2009 | Nirschl et al. | |
| 7,839,676 B2* | 11/2010 | Kurose et al. | 365/171 |
| 7,969,798 B2 | 6/2011 | Hwang et al. | |
| 8,040,714 B2 | 10/2011 | Choi et al. | |
| 8,335,101 B2* | 12/2012 | Jung et al. | 365/148 |
| 8,467,237 B2 | 6/2013 | Bedeschi et al. | |
| 2001/0012228 A1* | 8/2001 | Perner | 365/210 |
| 2005/0052896 A1 | 3/2005 | Kang | |

(Continued)

FOREIGN PATENT DOCUMENTS

| | | |
|---|---|---|
| JP | 2009-295264 | 12/2009 |
| JP | 2012-094234 | 5/2012 |

(Continued)

*Primary Examiner* — Alexander Sofocleous
*Assistant Examiner* — Muhammad Islam
(74) *Attorney, Agent, or Firm* — Onello & Mello, LLP.

(57) ABSTRACT

Provided is a nonvolatile memory device using a resistance material and a method of driving the nonvolatile memory device. The nonvolatile memory device comprises a resistive memory cell which stores multiple bits; a sensing node; a clamping unit coupled between the resistive memory cell and the sensing node and provides a clamping bias to the resistive memory cell; a compensation unit which provides a compensation current to the sensing node; a sense amplifier coupled to the sensing node and senses a change in a level of the sensing node; and an encoder which codes an output value of the sense amplifier in response to a first clock signal. The clamping bias varies over time. The compensation current is constant during a read period.

20 Claims, 16 Drawing Sheets

(56) References Cited

U.S. PATENT DOCUMENTS

| | | |
|---|---|---|
| 2008/0232177 A1* | 9/2008 | Choi et al. ............... 365/189.15 |
| 2009/0225594 A1 | 9/2009 | Choi et al. |
| 2009/0262573 A1 | 10/2009 | Choi et al. |
| 2009/0303785 A1 | 12/2009 | Hwang et al. |
| 2010/0085799 A1 | 4/2010 | Cho et al. |
| 2012/0063195 A1* | 3/2012 | Lam et al. .................... 365/148 |
| 2012/0092923 A1 | 4/2012 | Bedeschi et al. |
| 2012/0287730 A1* | 11/2012 | Kim ........................ 365/189.06 |

FOREIGN PATENT DOCUMENTS

| | | |
|---|---|---|
| KR | 2001-0050433 | 6/2001 |
| KR | 20050025822 | 3/2005 |
| KR | 2009-0109823 | 10/2009 |
| KR | 2009-0117464 | 11/2009 |

* cited by examiner

FIG. 1A

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | SA/WD(2_1) | | SA/WD(2_2) | | SA/WD(2_3) | | SA/WD(2_4) | |
| | PERIPHERY(3) | | | | | | | |
| | SA/WD(2_8) | | SA/WD(2_7) | | SA/WD(2_6) | | SA/WD(2_5) | |
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 1_16 | 1_15 | 1_14 | 1_13 | 1_12 | 1_11 | 1_10 | 1_9 |

# NONVOLATILE MEMORY DEVICE USING RESISTANCE MATERIAL AND METHOD OF DRIVING THE NONVOLATILE MEMORY DEVICE

CROSS-REFERENCE TO RELATED APPLICATIONS

This application claims priority from Korean Patent Application No. 10-2012-0120536 filed on Oct. 29, 2012 in the Korean Intellectual Property Office, the content of which is incorporated herein by reference in its entirety.

BACKGROUND

1. Field of the Inventive concept

The present inventive concept relates to a nonvolatile memory device using a resistance material and a method of driving the nonvolatile memory device.

2. Description of the Related Art

Examples of nonvolatile memories using resistance materials include phase-change random access memories (PRAMs), resistive RAMs (RRAMs), and magnetic RAMs (MRAMs). Dynamic RAMs (DRAMs) or flash memories typically store data by applying a charge trapping mechanism. Nonvolatile memories using resistance materials, on the other hand, store data according to a change in an electrical resistance, or state change, of a phase-change material such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

In particular, a phase-change material of a PRAM can be at a crystalline state or an amorphous state as it is cooled after being heated. The phase-change material has low a resistance in the crystalline state and has a high resistance in the amorphous state. Therefore, the crystalline state may be defined as set data or data 0, and the amorphous state may be defined as reset data or data 1.

SUMMARY

Aspects of the present inventive concept provide a nonvolatile memory device which can execute a read operation in a more reliable manner.

Aspects of the present inventive concept also provide a method of driving a nonvolatile memory device which can execute a read operation in a more reliable manner.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a nonvolatile memory device comprising: a resistive memory cell which stores multiple bits; a sensing node; a clamping unit coupled between the resistive memory cell and the sensing node, the clamping unit providing a clamping bias to the resistive memory cell, wherein the clamping bias varies over time; a compensation unit which provides a compensation current to the sensing node, wherein the compensation current is constant during a read period; a sense amplifier coupled to the sensing node, the sense amplifier sensing a change in a level of the sensing node; and an encoder which codes an output value of the sense amplifier in response to a first clock signal.

In an embodiment, the clamping bias increases over time.

In an embodiment, the clamping bias increases over time in the form of a k-th function, where k is a natural number.

In an embodiment, the clamping bias increases over time in a stepped manner.

In an embodiment, if first data is stored in the resistive memory cell, then the output value of the sense amplifier transitions after a first period of time from when the clamping bias begins to be provided, and if second data, which is different from the first data, is stored in the resistive memory cell, the output value of the sense amplifier transitions after a second period of time, which is different from the first period of time, from when the clamping bias begins to be provided.

In an embodiment, during the read period, the sense amplifier is enabled activated multiple times in response to a second clock signal.

In an embodiment, the compensation unit controls a time when the sense amplifier is enabled activated by adjusting the a magnitude of the compensation current.

In an embodiment, a memory cell array comprising comprises the resistive memory cell, the memory cell array has having a cross-point structure.

According to another aspect of the present inventive concept, there is provided a nonvolatile memory device comprising: a resistive memory cell which stores multiple bits; a sensing node; a clamping unit coupled between the resistive memory cell and the sensing node and provides a clamping bias to the resistive memory cell, wherein the clamping bias varies over time; a compensation unit which provides a compensation current to the sensing node, wherein the compensation current is constant during a read period; and a sense amplifier which is connected to the sensing node and senses a change in a level of the sensing node in response to a clock signal.

In an embodiment, wherein the clamping bias increases over time.

In an embodiment, the clamping bias increases over time in the form of a k-th function, where k is a natural number.

In an embodiment, the clamping bias increases over time in a stepped fashion.

In an embodiment, if first data is stored in the resistive memory cell, then the output value of the sense amplifier transitions after a first period of time from when the clamping bias begins to be provided, and if second data, which is different from the first data, is stored in the resistive memory cell, then the output value of the sense amplifier transitions after a second period of time, which is different from the first period of time, from when the clamping bias begins to be provided.

In an embodiment, the compensation unit controls a time when the sense amplifier is enabled by adjusting the magnitude of the compensation current.

In an embodiment, a memory cell array comprising the resistive memory cell has a cross-point structure.

According to another aspect of the present inventive concept, there is provided a nonvolatile memory device comprising: a resistive memory cell; a compensation unit; a sensing node coupled between the compensation unit and the resistive memory cell, the compensation unit providing a compensation current to the sensing node; a clamping unit coupled between the resistive memory cell and the sensing node, the clamping unit providing a clamping bias to the resistive memory cell, wherein the clamping bias varies over time; a sense amplifier coupled to the sensing node, the sense amplifier sensing a change in a level of the sensing node related to the compensation current, compares the level of the sensing node to a reference value, and generates an output value in response to the comparison, wherein a time during which the output value transitions according to a state of data stored in the resistive memory cell.

In an embodiment, the nonvolatile memory device further comprises an encoder which codes the output value in response to a clock signal.

In an embodiment, the clamping bias increases over time.

In an embodiment, if first data is stored in the resistive memory cell, then the output value of the sense amplifier transitions after a first period of time from when the clamping bias begins to be provided, and if second data, which is different from the first data, is stored in the resistive memory cell, then the output value of the sense amplifier transitions after a second period of time, which is different from the first period of time, from when the clamping bias begins to be provided.

In an embodiment, the compensation unit controls a time when the sense amplifier is enabled by adjusting the magnitude of the compensation current.

BRIEF DESCRIPTION OF THE DRAWINGS

The above and other aspects and features of the present inventive concept will become more apparent by describing in detail exemplary embodiments thereof with reference to the attached drawings, in which:

FIG. 1A is a block diagram of a configuration of a nonvolatile memory device according to embodiments of the present inventive concept.

DETAILED DESCRIPTION OF THE EMBODIMENTS

Figure 1B:
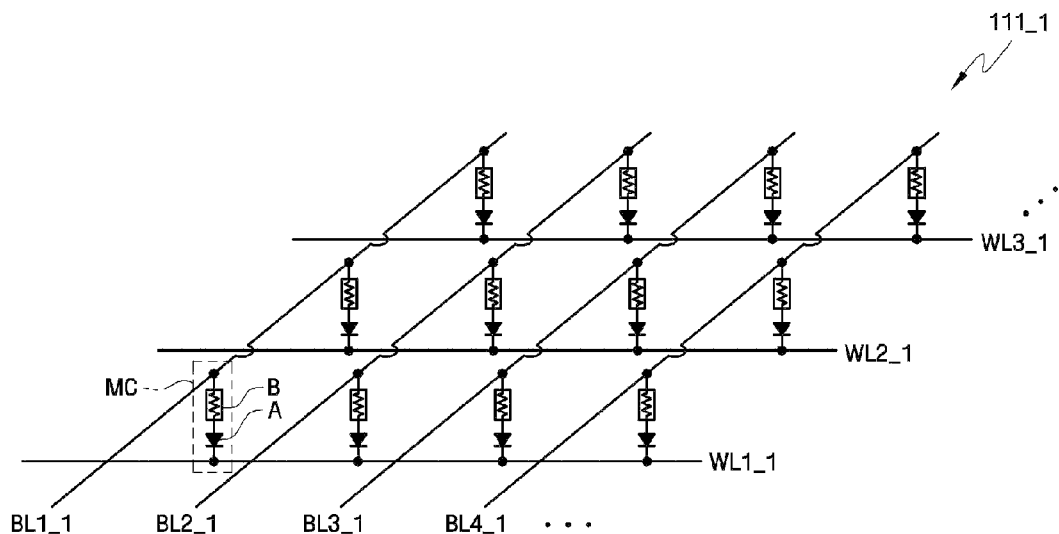
FIGS. 1B and 1C are diagrams illustrating a memory cell array of FIG. 1A.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known methods, procedures, components, and circuitry have not been described in detail to avoid unnecessarily obscuring aspects of the present invention.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present inventive concept are described that include a phase-change random access memory (PRAM). However, it is obvious to those of ordinary skill in the art to which the present inventive concept pertains that the present inventive concept can be applied to other nonvolatile memories using resistance materials, including but not limited to resistive RAMs (RRAMs) and magnetic RAMs (MRAMs).

FIG. 1A is a block diagram of a configuration of a nonvolatile memory device according to embodiments of the present inventive concept. As shown in FIG. 1A, the nonvolatile memory device can include, but is not limited to, sixteen memory banks.

The nonvolatile memory device according to the embodiments of the present inventive concept includes a memory cell array, a plurality of sense amplifier and write drivers 2_1 through 2_8, and a peripheral circuit region 3.

The memory cell array may include a plurality of memory banks 1_1 through 1_16. Each of the memory banks 1_1 through 1_16 may include but not limited to a plurality of memory blocks, for example, eight memory blocks BLK0 through BLK7. Each of the memory blocks BLK0 through BLK7 includes a plurality of nonvolatile memory cells arranged in a matrix.

Although not shown in the drawing, a row select circuit and a column select circuit can be provided that correspond to the memory banks 1_1 through 1_16, respectively. The row select circuit and the column select circuit can respectively designate a row and a column of resistive memory cells to be written to and/or read from.

Each of the sense amplifier and write drivers 2_1 through 2_8 can be constructed and arranged to correspond to two of the memory banks 1_1 through 1_16, and execute read and write operations on the two corresponding memory banks. Each of the sense amplifier and write drivers 2_1 through 2_8 can correspond to, but not be limited to, two of the memory banks 1_1 through 1_16. For example, each of the sense amplifier and write drivers 2_1 through 2_8 may correspond to one memory bank or four memory banks.

The peripheral circuit region 3 may include a plurality of logic circuit blocks and a voltage generator needed to operate the column select circuit, the row select circuit, and the sense amplifier and write drivers 2_1 through 2_8.

Figure 1C:
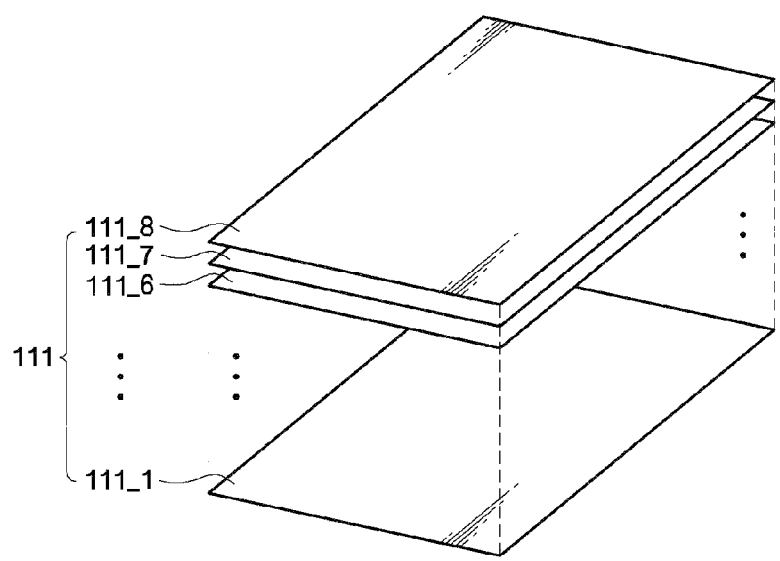

FIGS. 1B and 1C are diagrams illustrating a memory cell array of FIG. 1A.

Referring to FIG. 1B, the memory cell array may have a cross-point structure. In the cross-point structure, one memory cell is formed in a region in which one line crosses another line. For example, bit lines BL1_1 through BL4_1 may extend in a first direction, and word lines WL1_1 through WL3_1 may extend in a second direction to cross the bit lines BL1_1 through BL4_1. A resistive memory cell MC may be formed in a region in which each of the bit lines BL1_1 through BL4_1 crosses each of the word lines WL1_1 through WL3_1, respectively.

Alternatively, the memory cell array may have a 3D stacked structure as shown in FIG. 1C. The 3D stacked structure may denote a vertical stack of a plurality of memory cell layers 111_1 through 111_8 (generally, 111). In the drawing, eight memory cell layers 111_1 through 111_8 are shown as being stacked. However, the present inventive concept is not limited to eight memory cell layers. Each of the memory cell layers 111_1 through 111_8 may include a plurality of memory cell groups and/or a plurality of redundancy memory cell groups. If the memory cell array has the 3D stacked structure, each of the memory cell layers 111_1 through 111_8 may have the cross-point structure shown in FIG. 1B. However, the present inventive concept is not limited thereto.

Figure 2:
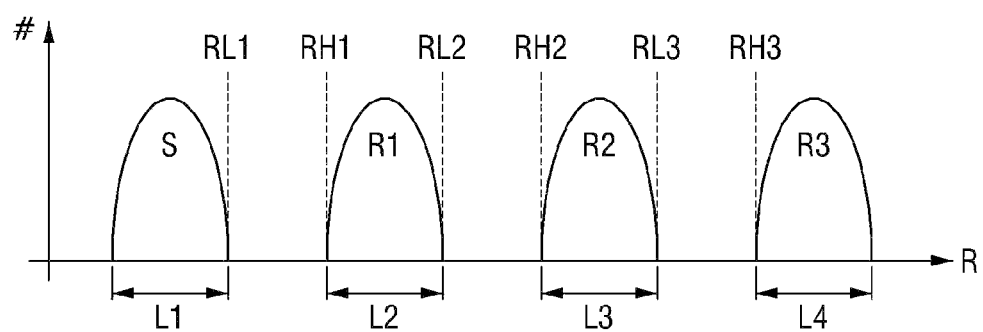
FIGS. 2 and 3 are diagrams illustrating resistance distributions of resistive memory cells used in nonvolatile memory devices according to embodiments of the present inventive concept.
Figure 3:
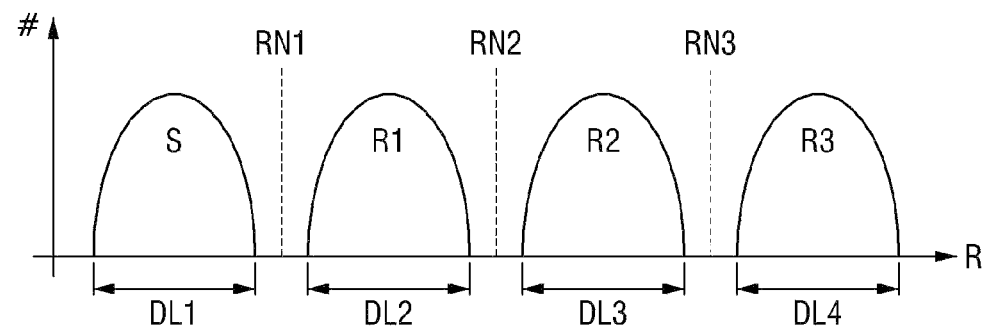

FIGS. 2 and 3 are diagrams illustrating resistance distributions of resistive memory cells used in nonvolatile memory devices according to embodiments of the present inventive concept.

Referring to FIG. 2, one or more resistive memory cells may be multi-bit cells. Each of the resistive memory cells may store any one of first through fourth data S, R1, R2 and R3. The resistance distribution illustrated in FIG. 2 may be a distribution immediately after a write operation.

The first through fourth data S through R3 may correspond to first through fourth resistance levels L1 through L4, respectively. The resistance value may increase in the order of the first, second, third and fourth resistance levels L1, L2, L3 and L4. For example, the first resistance level L1 may be smaller than RL1, the second resistance level L2 may be greater than RH1 and smaller than RL2, the third resistance level L3 may be greater than RH2 and smaller than RL3, and the fourth resistance level L4 may be greater than RH3. Here, RL1, RL2, RL3, RH1, RH2 and RH3 may include reference values used in a verity read operation for verifying whether a write operation has been performed correctly.

The resistance distribution illustrated in FIG. 3 may include a distribution after a predetermined period of time after a write operation. First through fourth data S through R3 may correspond to first through fourth resistance levels DL1 through DL4, respectively. It can be seen that the first through fourth resistance levels D1 through DL4 of FIG. 3 are wider than the first through fourth resistance levels L1 through L4 of FIG. 2.

RN1 is a resistance value between the first resistance level DL1 and the second resistance level DL2, RN2 is a resistance value between the second resistance level DL2 and the third resistance level DL3, and RN3 is a resistance value between the third resistance level DL3 and the fourth resistance level DL4. Here, RN1 through RN3 may include reference values used in a normal read operation. For example, a resistive memory cell having a resistance value smaller than RN1 may store the first data S.

Figure 4:
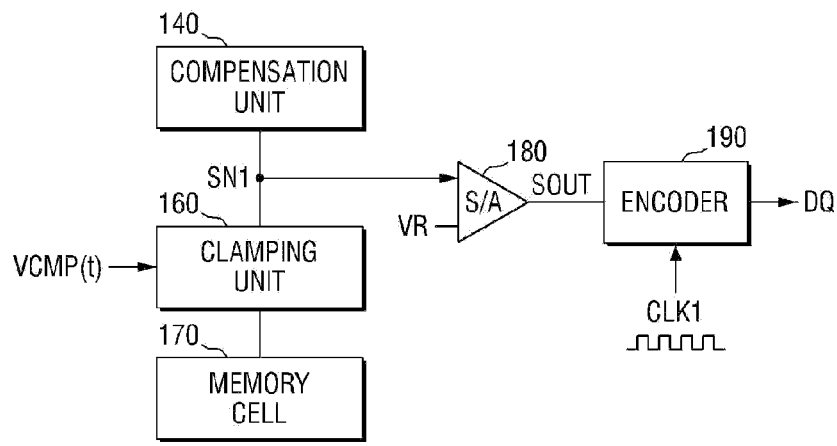
FIG. 4 is a block diagram of a nonvolatile memory device according to an embodiment of the present inventive concept.
Figure 5:
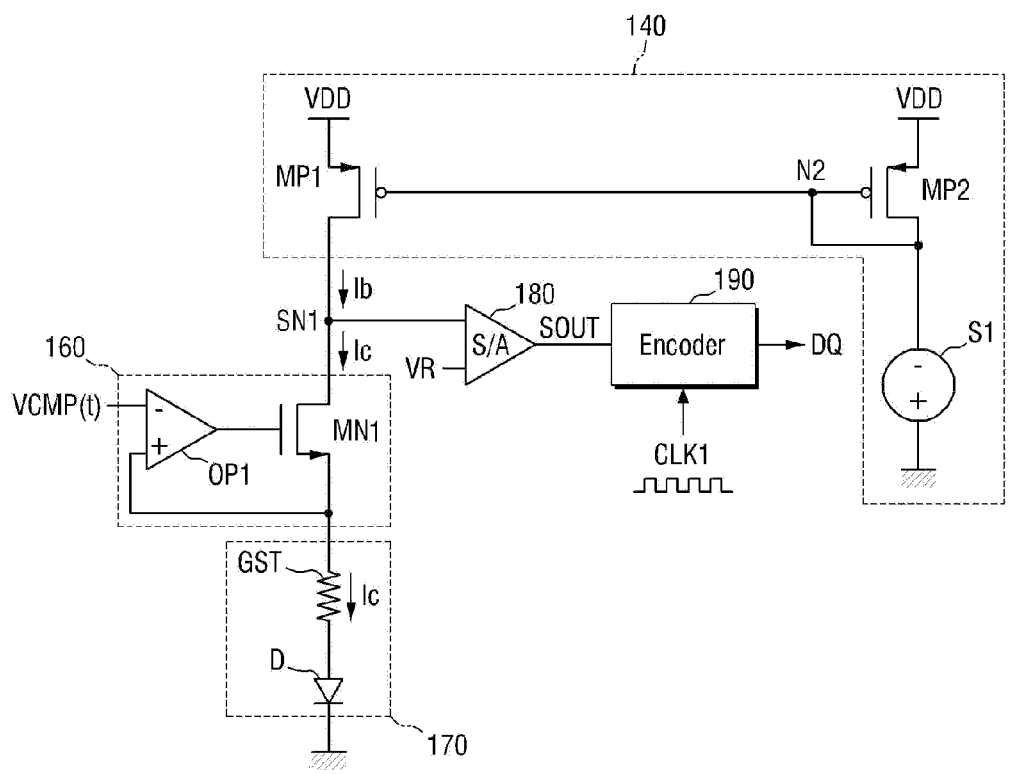
FIG. 5 is a circuit diagram of a nonvolatile memory device shown in FIG. 4.

FIG. 4 is a block diagram of a nonvolatile memory device according to an embodiment of the present inventive concept. FIG. 5 is a circuit diagram of the nonvolatile memory device shown in FIG. 4.

Referring to FIGS. 4 and 5, the nonvolatile memory device according to the current embodiment may include a resistive memory cell 170, a compensation unit 140, a clamping unit 160, a sensing node SN1 between the compensation unit 140 and the clamping unit 160, a sense amplifier 180, also referred to as a sense amp, and an encoder 190. The sensing node SN1 can be coupled to an input of the sense amp 180.

The resistive memory cell 170 shown in FIGS. 4 and 5 may be a resistive memory cell selected to be read from a plurality of resistive memory cells in a memory cell array. In an embodiments where the resistive memory cell 170 is a PRAM, the resistive memory cell 170 may include a variable resistive element GST which contains a phase-change material and an access element D which controls an electric current flowing through the variable resistive element GST. Here, the access element D may be a diode or transistor connected in series to the variable resistive element GST. In addition, examples of the phase-change material include a combination of two elements such as GaSb, InSb, InSe, $Sb_2Te_3$ or GeTe, a combination of three elements such as GeSbTe, GaSeTe, InSbTe, $SnSb_2Te_4$ or InSbGe, and a combination of four elements such as AgInSbTe, (GeSn)SbTe, GeSb(SeTe) or $Te_{81}Ge_{15}Sb_2S_2$. Among them, GeSbTe that contains germanium (Ge), antimony (Sb), and tellurium (Te) may typically be included as at least part of a phase-change material.

If the resistive memory cell 170 is an RRAM, the variable resistive element GST may include, for example, NiO or perovskite. The perovskite may be a composition such as manganite ($Pr_{0.7}Ca_{0.3}MnO_3$, $Pr_{0.5}Ca_{0.5}MnO_3$, other PCMO, LCMO, etc), titanate (STO:Cr), or zirconate (SZO:Cr, $Ca_2Nb_2O_7$:Cr, $Ta_2O_5$:Cr). A filament may be formed in the variable resistive element GST. The filament can serve as a current path for a cell current Ic that flows through the resistive memory cell 170. The compensation unit 140 provides a first compensation current 1b to the sensing node SN1. Specifically, the compensation unit 140 provides the first compensation current Ib to the sensing node SN1 in order to compensate for a reduction in the level of the sensing node SN1 due to the cell current Ic that flows through the selected resistive memory cell 170. The compensation unit 140 may include a PMOS transistor MP1 connected between a power supply voltage VDD and the sensing node SN1 and a PMOS transistor MP2 and a source S1 connected between the power supply voltage VDD and a ground voltage, as illustrated in FIG. 5. The two PMOS transistors MP1 and MP2 may have respective gates connected to each other and may be constructed and arranged as current mirrors. A connector can extend from a node N1 between the PMOS transistors MP1, MP2 and the source S1.

In nonvolatile memory devices according to embodiments of the present inventive concept, even if multiple bits are stored in the resistive memory cell 170, the first compensation current 1b may be constant during a read period. For example, referring also to FIG. 3, the first compensation current 1b at the time of verifying whether first data S has been stored in the resistive memory cell 170 may be equal to the first compensation current 1b at the time of verifying whether third data R2 has been stored in the resistive memory cell 170.

The clamping unit 160 is connected between the resistive memory cell 170 and the sensing node SN1 and clamps the level of a bit line to a level within a proper range to read. Specifically, the clamping unit 160 clamps the level of the bit line to a level equal to or lower than a threshold voltage Vth of the phase-change material. This is because the bit line at a level equal to or higher than the threshold voltage Vth can change the phase of the phase-change material of the selected resistive memory cell 170. The clamping unit 160 may include an NMOS transistor MN1 and an OP amp OP1 connected between the resistive memory cell 170 and the sensing node SN1, as illustrated in FIG. 5.

In nonvolatile memory devices according to embodiments of the present inventive concept, the clamping unit 160 provides a clamping bias VCMP(t) to the resistive memory cell 170. The clamping bias VCMP(t) can vary over time during a read period. The clamping bias VCMP(t) may come in various forms. For example, the clamping bias VCMP(t) may increase linearly over time. Alternatively, the clamping bias VCMP(t) may increase over time in a stepped manner. For example, the clamping bias VCMP(t) can be output as a stepped analog signal, or signals increasing or decreasing over time. Alternatively, the clamping bias VCMP(t) can be in the form of a $k^{th}$ (k is a natural number) function.

The sense amp 180 is connected to the sensing node SN1 and senses a change in the level of the sensing node SN1. Specifically, the sense amp 180 compares the level of the sensing node SN1 with a reference level VR and outputs the comparison result, for example, as an output value SOUT. The sense amp 180 may include a current sense amplifier or a voltage sense amplifier.

As described above, during a read period, the first compensation current 1b remains constant, and the clamping bias VCMP(t) varies over time.

In this state, in nonvolatile memory devices according to embodiments of the present inventive concept, a time when an output value SOUT of the sense amp 180 transitions varies according to data stored in the resistive memory cell 170.

For example, if second data (e.g., R1) is stored in the resistive memory cell 170, the output value SOUT of the sense amp 180 may transition, e.g., from a high (H) state to a low (L) state, after a first period of time from when the clamping bias VCMP(t) begins to be provided. On the other hand, if the third data (e.g., R2 shown in FIG. 3), which is different from the second data (e.g., R1), is stored in the resistive memory cell 170, the output value SOUT of the sense amp 180 may transition after a second period of time, which is different from the first period of time, from when the clamping bias VCMP(t) begins to be provided. This will be described in more detail later with reference to FIGS. 6 and 7.

The encoder 190 is connected to an output terminal of the sense amp 180. The encoder 190 may code the output value SOUT of the sense amp 180 in response to a first clock signal CLK1.

Nonvolatile memory devices according to embodiments of the present inventive concept use a clamping bias that varies over time and code the output value SOUT of the sense amp 180 by using the first clock signal CLK1. Therefore, even if multiple bits are stored in a resistive memory cell, the compensation current 1b is constant during a read operation. That is, only one type of compensation current Ib can be used regardless of data stored in the resistive memory cell.

Figure 6:
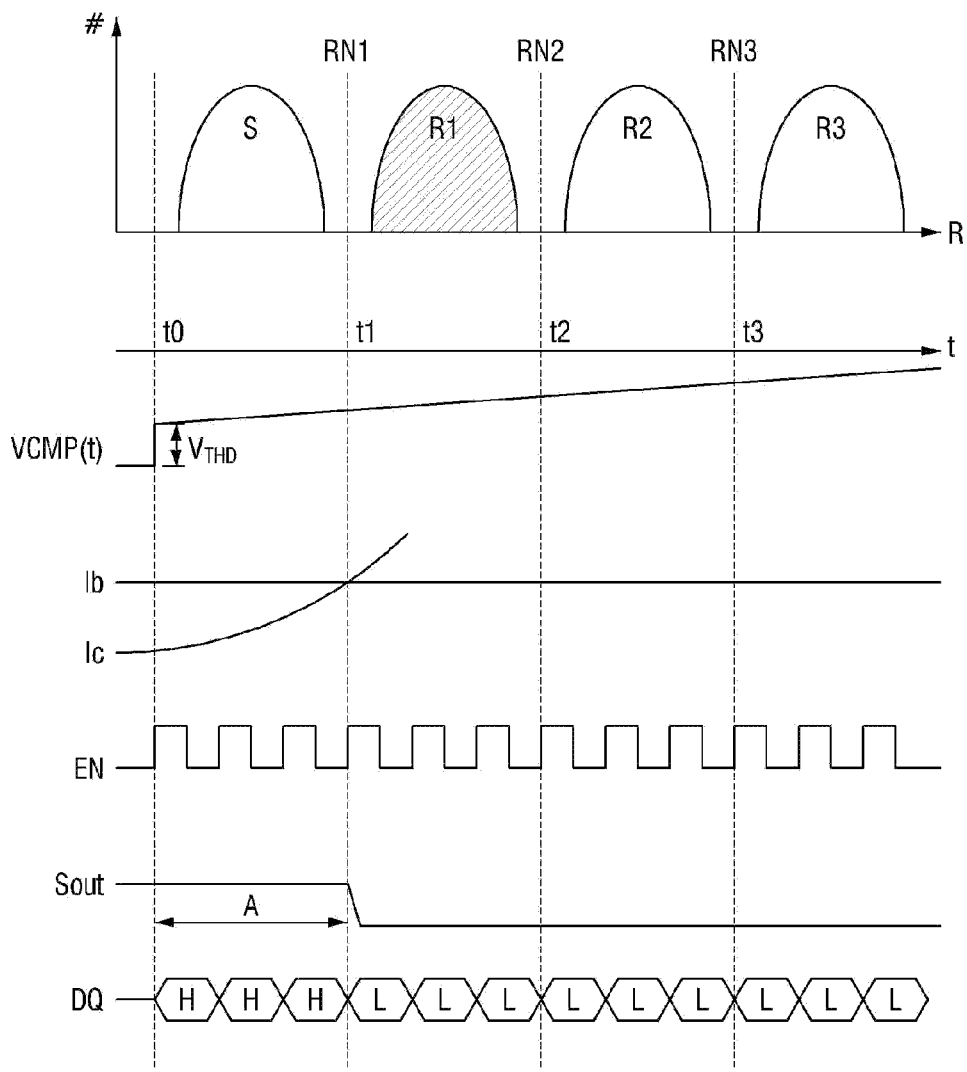
FIGS. 6 and 7 are timing diagrams illustrating a method of driving a nonvolatile memory device according to an embodiment of the present inventive concept.
Figure 7:
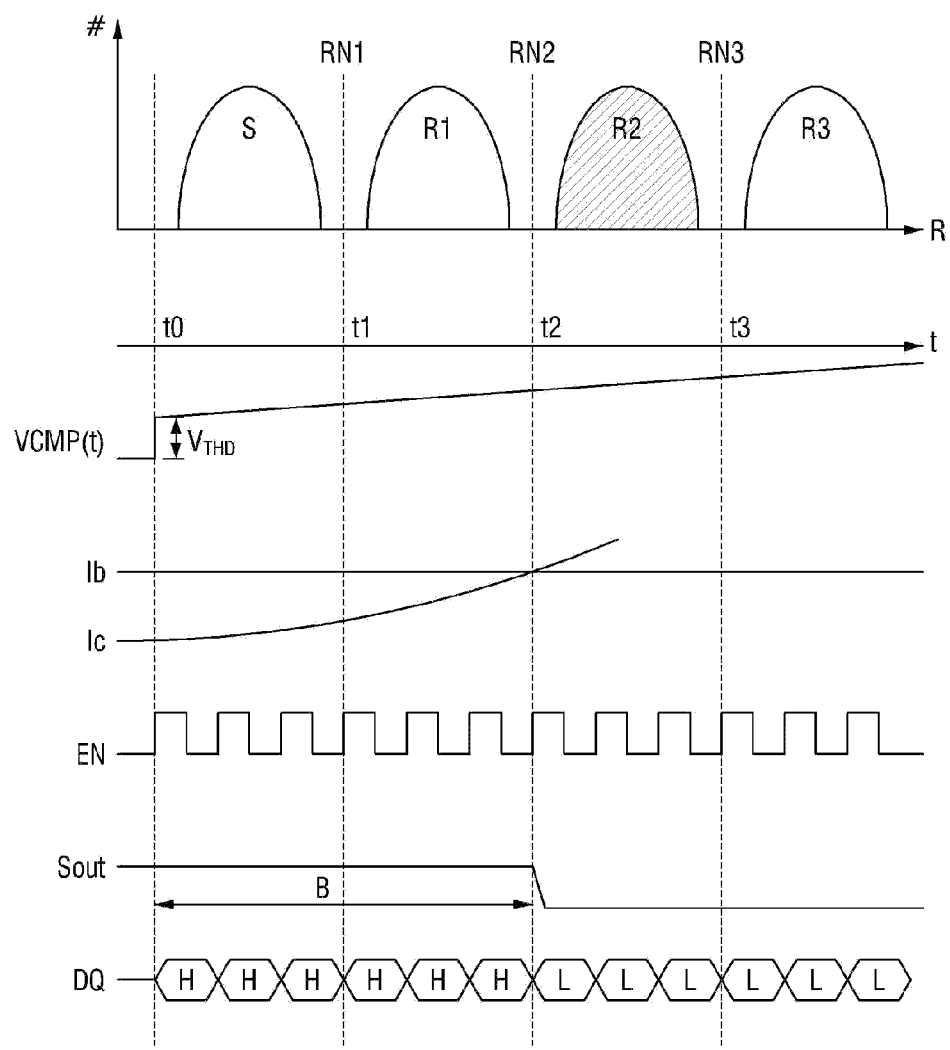

FIGS. 6 and 7 are timing diagrams illustrating a method of driving a nonvolatile memory device according to an embodiment of the present inventive concept. In FIGS. 6 and 7, a normal read operation is illustrated.

FIG. 6 is a timing diagram illustrating a case where the second data R1 is stored in the resistive memory cell 170.

Referring to FIG. 6, a read operation begins at a time to. The clamping bias VCMP(t) is enabled. As shown in the drawing, an initial value of the clamping bias VCMP(t) may be a threshold voltage VTHD of the access element D of the resistive memory cell 170 shown in FIG. 4. The first compensation current 1b remains constant, and the clamping bias VCMP(t) increases over time. As the clamping bias VCMP(t) increases, the cell current 1c flowing through the resistive memory cell 170 begins to increase. When the first compensation current 1b is greater than the cell current Ic, the output value SOUT of the sense amp 180 is at a logic high. The encoder 190 codes the output value SOUT of the sense amp 180 in response to the first clock signal CLK1. As a result, the encoder 190 outputs a value, for example, HHH.

The cell current Ic can continue to increase until a time t1, where the cell current Ic is equal to the first compensation current Ib. The cell current Ic can continue to increase until the cell current Ic is greater than the first compensation current 1b. At the time t1, the level of the sensing node SN1 can begin to change. The sense amp 180 can sense the change in the level of the sensing node SN1. Accordingly, the output value SOUT of the sense amp 180 can transition from a logic high to a logic low. The encoder 190 can code the output value SOUT of the sense amp 180 in response to the first clock signal CLK1. As a result, the encoder 190 outputs a value, for example, LLL.

Here, if the second data R1 is stored in the resistive memory cell 170, the output value SOUT of the sense amp 180 transitions after a first period of time A from the time t0 when the clamping bias VCMP(t) initiated.

At times t2 and t3, since the clamping bias VCMP(t) increases continuously, the cell current 1c also increases and is greater than the first compensation current 1b. The clamping bias VCMP(t) increases continuously as long as the phase of the phase-change material of the resistive memory cell 170 is not changed. Therefore, the output value SOUT of the sense amp 180 remains at the logic low. In addition, the encoder 190 outputs a value, for example, LLL.

FIG. 7 is a timing diagram illustrating a case where the third data R2 is stored in the resistive memory cell 170. Aspects and features substantially identical to those described above with reference to FIG. 6 will be omitted for brevity.

Referring to FIG. 7, a read operation begins at a time to. The first compensation current 1b remains constant, and the clamping bias VCMP(t) increases over time. As the clamping bias VCMP(t) increases, the cell current 1c begins to increase. However, since the first compensation current Ib is greater than the cell current Ic, the output value SOUT of the sense amp 180 is at a logic high.

At a time t1, the first compensation current Ib is still greater than the cell current Ic. Accordingly, the output value SOUT of the sense amp 180 remains at the logic high.

The cell current Ic can continue to increase until a time t2, wherein the cell current Ic is equal to the first compensation current Ib. the cell current Ic can continue to increase until the cell current Ic is greater than the first compensation current 1b. At the time t2, the level of the sensing node SN1 can begin to change. The sense amp 180 can sense the change in the level of the sensing node SN1. Accordingly, the output value SOUT of the sense amp 180 can transition from a logic high to a logic low. The encoder 190 can code the output value SOUT of the sense amp 180 in response to the first clock signal CLK1. As a result, the encoder 190 outputs a value, for example, LLL.

Here, if the third data R2 is stored in the resistive memory cell 170, the output value SOUT of the sense amp 180 transitions after a second period of time B from the time t0 when the clamping bias VCMP(t) initiated.

At a time t3, since the clamping bias VCMP(t) increases, the cell current 1c also increases and is greater than the first compensation current 1b. Therefore, the output value SOUT of the sense amp 180 remains at the logic low. In addition, the encoder 190 outputs a value, for example, LLL.

Referring to FIGS. 6 and 7, in nonvolatile memory devices according to embodiments of the present inventive concept, the time period (see, for example, A and B illustrated at FIGS. 6 and 7, respectively) when the output value SOUT of the sense amp 180 transitions varies according to data stored in the resistive memory cell 170.

Furthermore, the encoder 190 is connected to the output terminal of the sense amp 180 and can output a different logic value according to data stored in the resistive memory cell 170. That is, the encoder 190 may output "HHHLLLLLLLLL" or "HHHHHHLLLLLL" according to data stored in the resistive memory cell 170.

Figure 8:
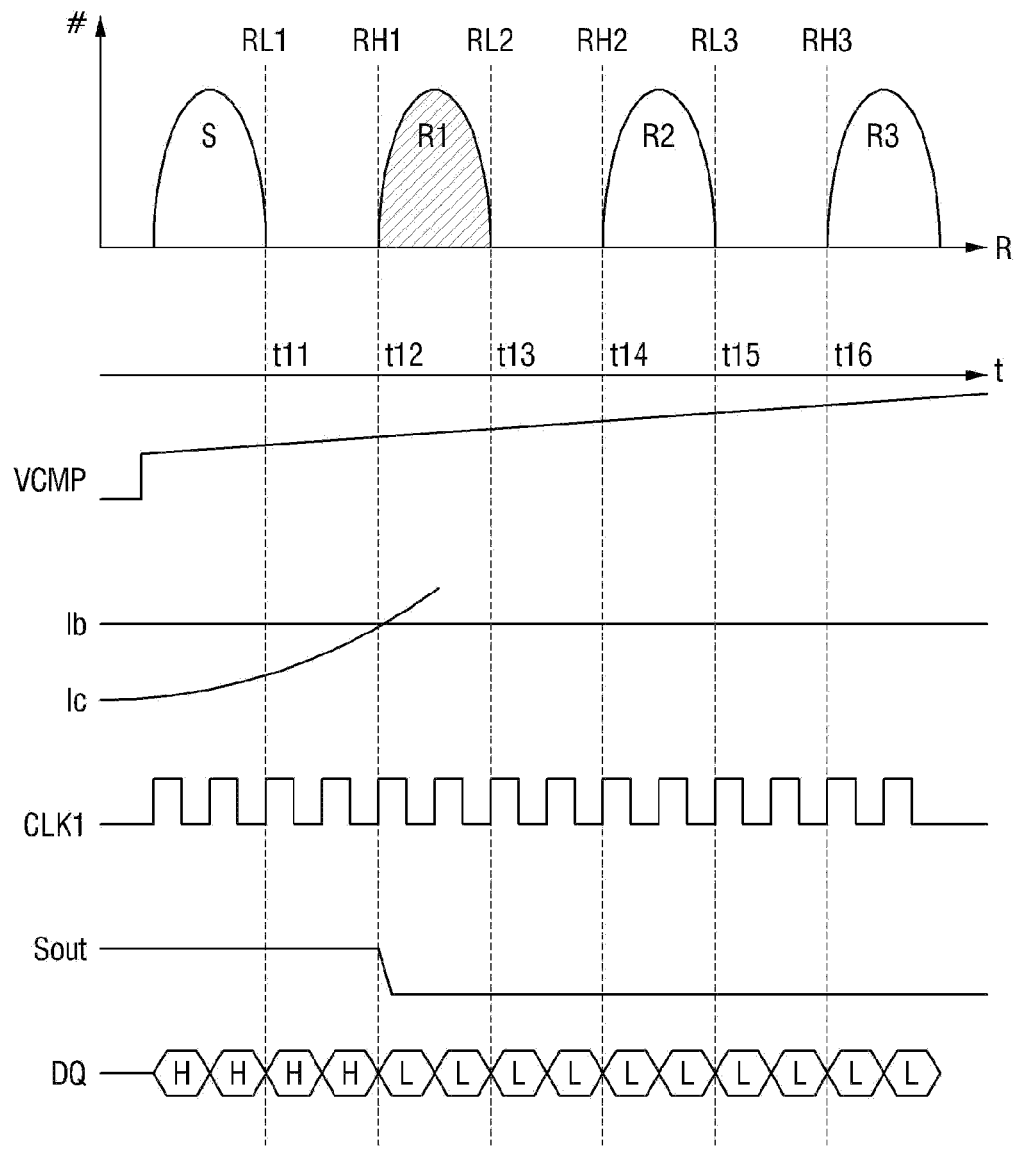
FIG. 8 is a timing diagram illustrating a method of driving a nonvolatile memory device according to another embodiment of the present inventive concept.

FIG. 8 is a timing diagram illustrating a method of driving a nonvolatile memory device according to another embodiment of the present inventive concept. In FIG. 8, a verify read operation is illustrated.

FIG. 8 illustrates a case where it is verified whether a resistance value of the resistive memory cell 170 is greater than RH1 after the second data R1 is written to the resistive memory cell 170 Although not described herein, those of ordinary skill in the art to which the present inventive concept pertains may infer a method of comparing the resistance value of the resistive memory cell 170 with RL1, RL2, RH2, RL3, and RH3 from the following description.

Referring to FIG. 8, at a time t12, the cell current Ic increases to the first compensation current Ib and ultimately becomes greater than the first compensation current 1b. Here, the level of the sensing node SN1 begins to change. In particular, the sense amp 180 senses the change in the level of the sensing node SN1. Accordingly, the output value SOUT of the sense amp 180 can transition from a logic high to a logic low. The encoder 190 codes the output value SOUT of the sense amp 180 in response to the first clock signal CLK1.

Figure 9:
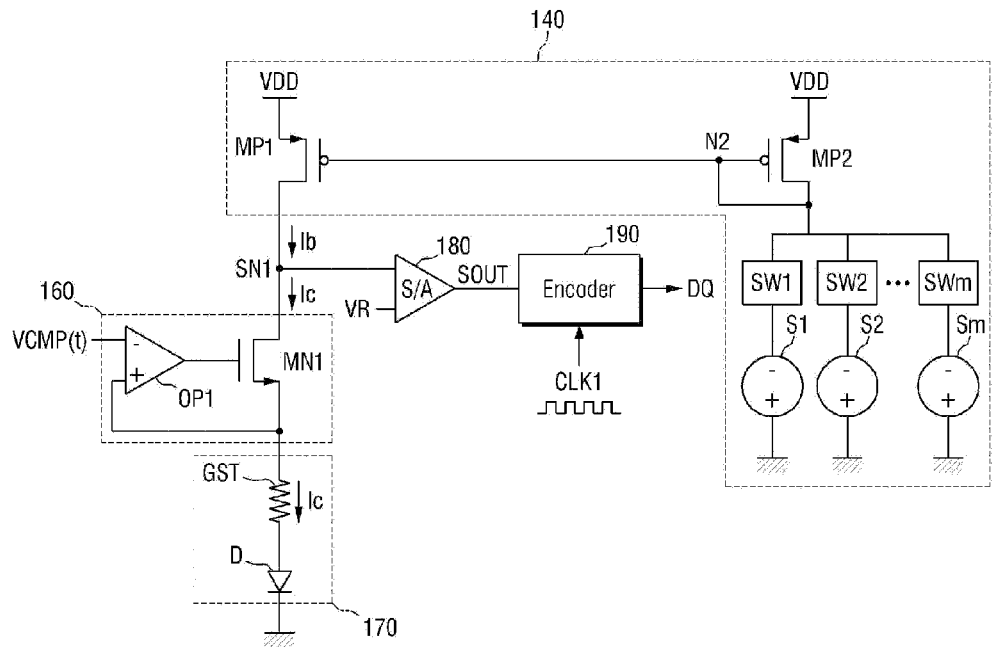
FIG. 9 is a circuit diagram of a nonvolatile memory device according to another embodiment of the present inventive concept.
Figure 10:
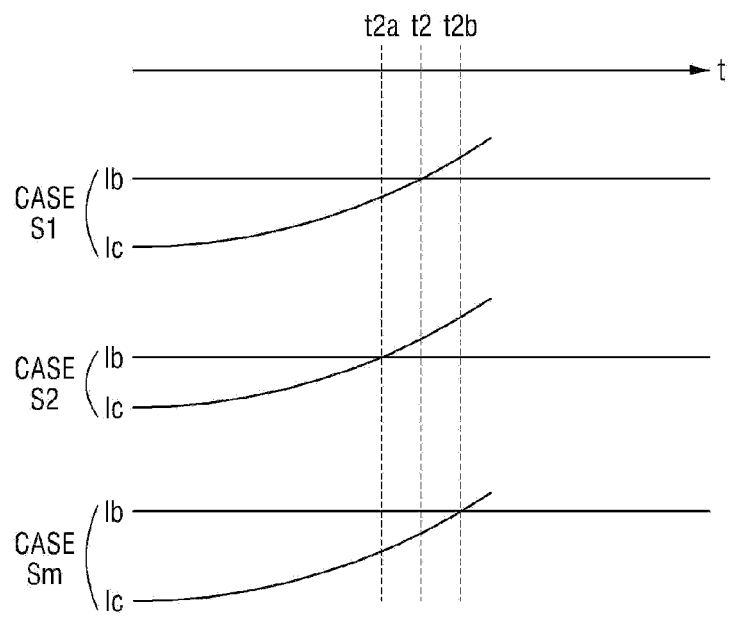
FIG. 10 is a timing diagram illustrating a method of driving a nonvolatile memory device shown in FIG. 9.

FIG. 9 is a circuit diagram of a nonvolatile memory device according to another embodiment of the present inventive concept. FIG. 10 is a timing diagram illustrating a method of driving the nonvolatile memory device shown in FIG. 9. For simplicity, the current embodiment will hereinafter be described, focusing mainly on differences with respect to the embodiments described in FIGS. 4 and 5.

Referring to FIG. 9, in the nonvolatile memory device according to the current embodiment, a compensation unit 140 may control a time when a sense amp 180 is enabled by adjusting the magnitude of a first compensation current 1b.

The compensation unit 140 includes PMOS transistors MP1 and MP2, a plurality of switches SW1 through SWm, and a plurality of sources S1 through Sm, where m is a natural number of two or greater. At least one of the sources S1 through Sm may be selected by turning on at least one of the switches SW1 through SWm. Accordingly, the amount of the first compensation current 1b can be adjusted.

A case where the third data R3 is stored in the resistive memory cell 170 is described with reference to FIG. 10.

Referring to FIG. 10, in a case CASE S1 where a source S1 is selected, a cell current 1c may become greater than the first compensation current 1b at a time t2.

In a case CASE S2 where a source S2 is selected, the cell current 1c may become greater than the first compensation current 1b at a time t2a. That is, when the source S2 is selected, the sense amp 180 may be enabled earlier than a time when the source S1 is selected.

In a case CASE Sm, where m is an integer, where a source Sm is selected, the cell current 1c may become greater than the first compensation current 1b at a time t2b. That is, when the source Sm is selected, the sense amp 180 may be enabled later than when the source S1 is selected.

As described above, the enable timing of the sense amp 180 can be controlled by adjusting the amount of the first compensation current 1b. It is therefore possible to control the sensing timing.

Figure 11:
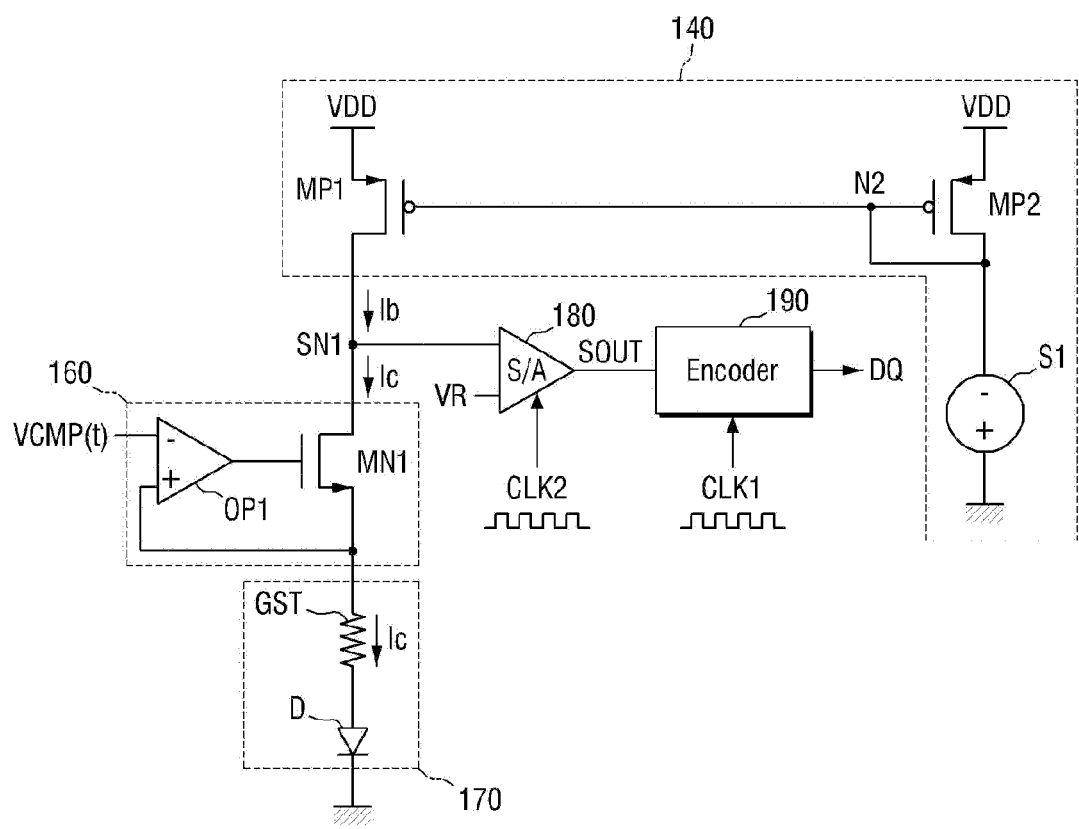
FIG. 11 is a block diagram of a nonvolatile memory device according to other embodiments of the present inventive concept.

FIG. 11 is a block diagram of a nonvolatile memory device according to other embodiments of the present inventive concept. For simplicity, embodiments will hereinafter be described, focusing mainly on differences with the pervious embodiment of FIGS. 4 and 5.

Referring to FIG. 11, in the nonvolatile memory device according to the current embodiments, a sense amp 180 may operate in response to a second clock signal CLK2. As described above, a clamping bias VCMP(t) may increase over time, and a compensation current 1b may be constant during a read period. In addition, a time when an output value SOUT of a sense amp 180 transitions may vary according to data stored in a resistive memory cell 170. For example, if second data (e.g., R1) is stored in the resistive memory cell 170, the output value SOUT of the sense amp 180 may transition between states, for example, from an H state to an L state, after a first period of time from when the clamping bias VCMP(t) begins to be provided. On the other hand, if third data (e.g., R2), which is different from the second data (e.g., R1), is stored in the resistive memory cell 170, the output value SOUT of the sense amp 180 may transition after a second period of time, which is different from the first period of time, from when the clamping bias VCMP(t) begins to be provided. Accordingly, a time when the output value transitions can be constant regardless of data stored in the resistive memory cell.

Figure 12:
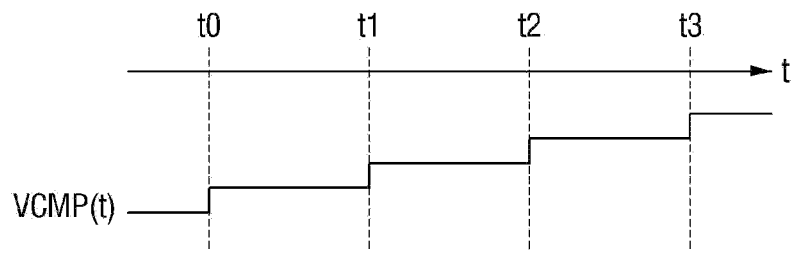
FIGS. 12 through 14 are diagrams illustrating examples of a clamping bias VCMP(t) used in nonvolatile memory devices according to embodiments of the present inventive concept.
Figure 13:
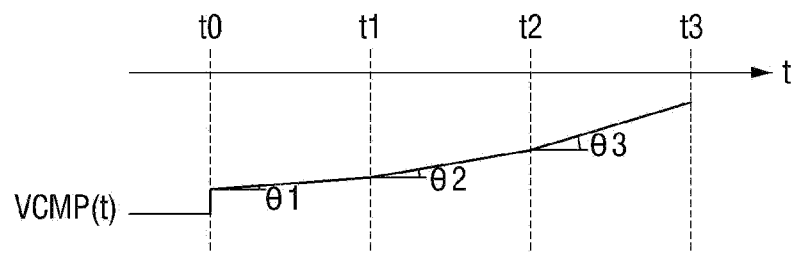
Figure 14:
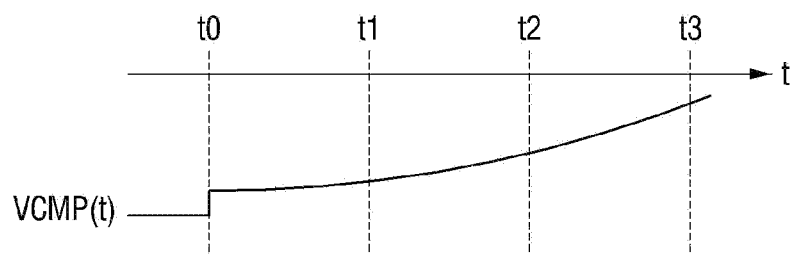

FIGS. 12 through 14 are diagrams illustrating examples of the clamping bias VCMP(t) used in nonvolatile memory devices according to embodiments of the present inventive concept.

Referring to FIG. 12, the clamping bias VCMP(t) may increase over time in a stepped manner.

Referring to FIG. 13, the clamping bias VCMP(t) may have a different slope in each period. For example, the clamping bias VCMP(t) may have a slope of 1θ in a period of t0 to t1, a slope of θ2 in a period of t1 to t2, and a slope of θ3 in a period between t2 and t3. Here, θ2 may be, but is not limited to, greater than θ1, and θ3 may be, but is not limited to, greater than θ2.

Referring to FIG. 14, the clamping bias VCMP(t) may increase over time in the form of a $k^{th}$ function, where k is a natural number. In FIG. 14, the clamping bias VCMP(t) increases in the form of a quadratic function. However, the present inventive concept is not limited thereto.

FIGS. 15 through 19 are diagrams illustrating memory systems according to embodiments of the present inventive concept. Specifically, FIGS. 15 through 19 are diagrams illustrating memory systems using nonvolatile memory devices according to embodiments of the present inventive concept.

Figure 15:
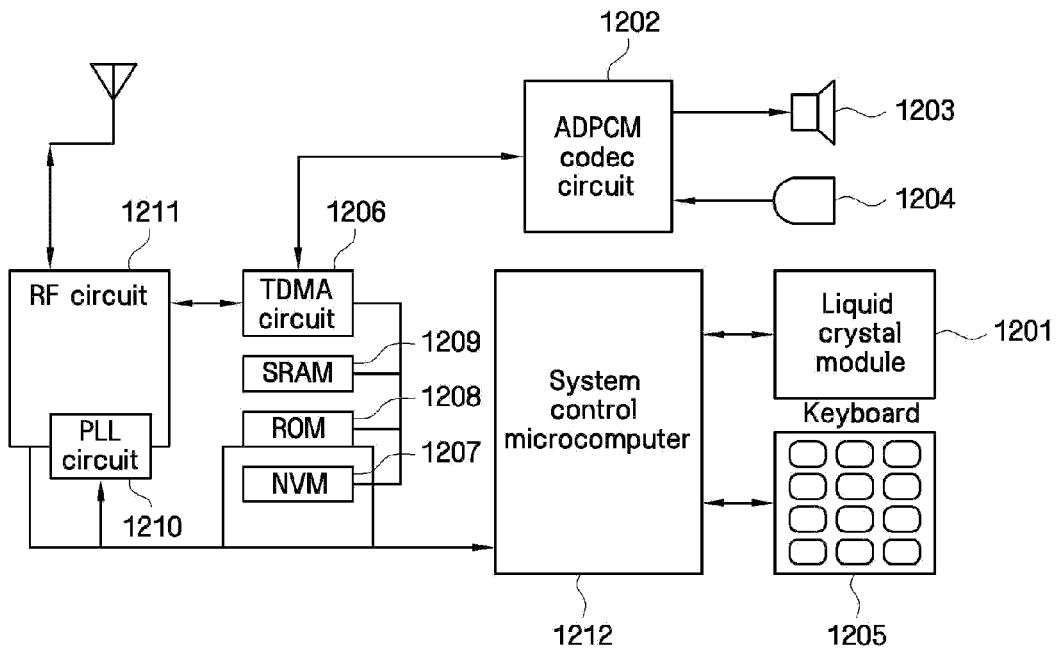
FIGS. 15 through 19 are diagrams illustrating memory systems according to embodiments of the present inventive concept.

FIG. 15 is a diagram illustrating a cellular phone system which uses nonvolatile memory devices according to embodiments of the present inventive concept Referring to FIG. 15, the cellular phone system includes an adaptive differential pulse code modulation (ADPCM) codec circuit 1202 which compresses sound or decompresses compressed sound, a speaker 1203, a microphone 1204, a time division multiple access (TDMA) circuit 1206 which time-division multiplexes digital data, a phase-locked loop (PLL) circuit 1210 which sets a carrier frequency of a wireless signal, and a radio frequency (RF) circuit 1211 which transmits or receives a wireless signal.

In addition, the cellular phone system may include various types of memory devices. For example, the cellular phone system may include a nonvolatile memory device 1207, a read only memory (ROM) 1208, and a static random access memory (SRAM) 1209. The nonvolatile memory device 1207 may be any nonvolatile memory device according to embodiments of the present inventive concept, and may store, for example, an identification (ID) number. The ROM 1208 may store programs, and the SRAM 1209 may serve as a work area for a system control microcomputer 1212 or temporarily store data. The system control microcomputer 1212 may include a processor and may control the write operation and read operation of the nonvolatile memory device 1207.

Figure 16:
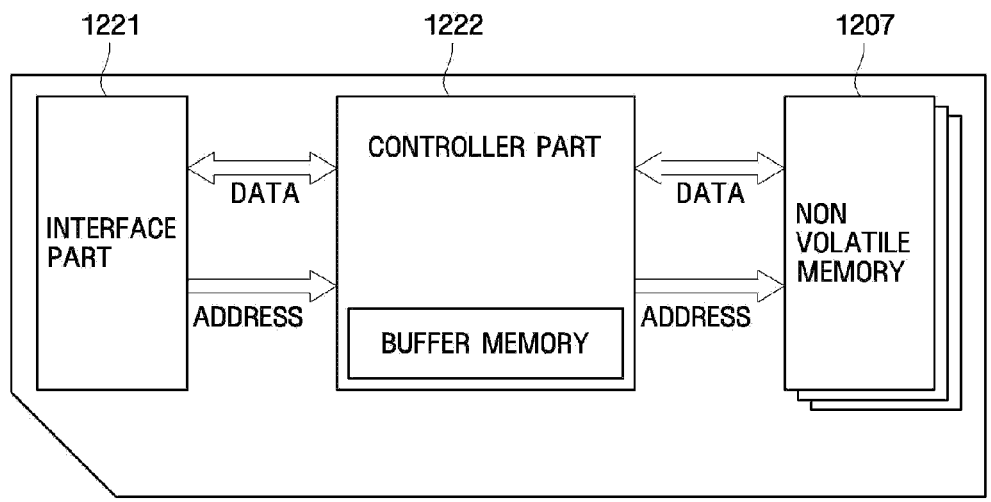

FIG. 16 is a diagram illustrating a memory card which uses nonvolatile memory devices according to embodiments of the present inventive concept. The memory card may be, for example, a multimedia card (MMC), a secure digital (SD) card, a multi-use card, a micro SD card, a memory stick, a compact SD card, an ID card, a personal computer memory card international association (PCMCIA) card, a solid-state drive (SSD) card, a chip card, a smart card, or a universal serial bus (USB) card.

Referring to FIG. 16, the memory card may include an interface part 1221 which interfaces with an external device, a controller part 1222 which includes a buffer memory and controls the operation of the memory card, and one or more nonvolatile memory devices 1207 according to embodiments of the present inventive concept. The controller part 1222 is a processor and may control the write and read operations of the nonvolatile memory devices 1207. Specifically, the controller part 1222 is coupled to the interface part 1221 and each of the nonvolatile memory devices 1207 by a data bus DATA and an address bus ADDRESS.

Figure 17:
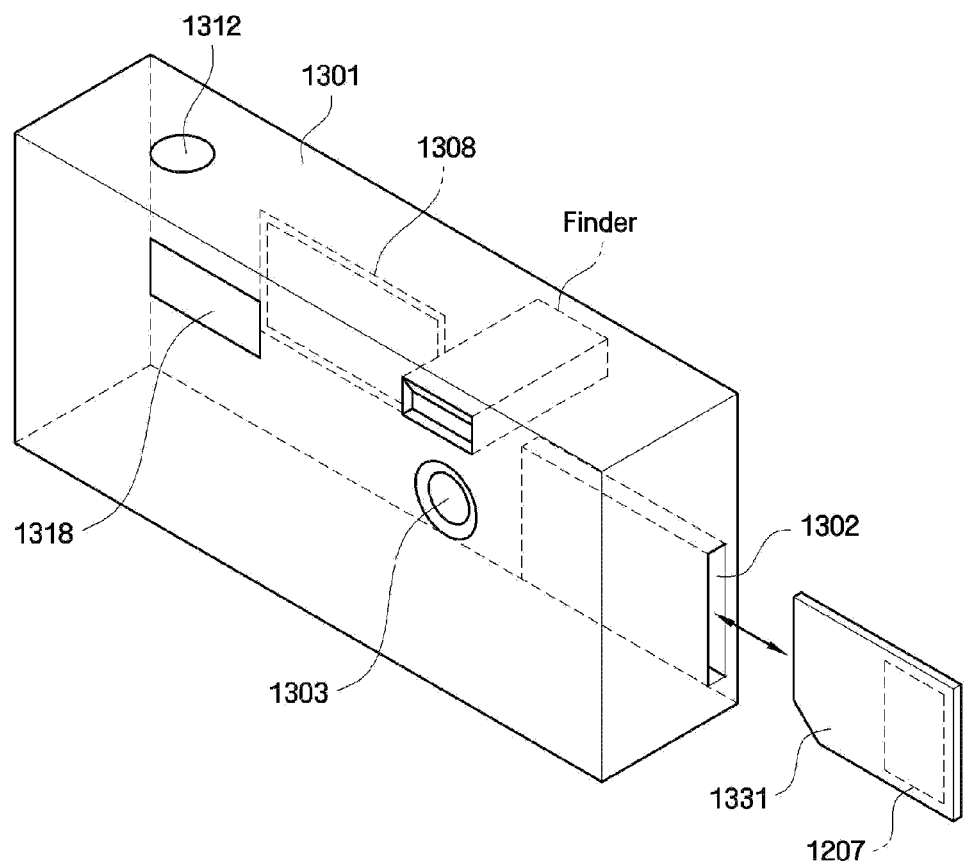

FIG. 17 is a diagram illustrating a digital still camera which uses nonvolatile memory devices according to embodiments of the present inventive concept.

Referring to FIG. 17, the digital still camera includes a body 1301, a slot 1302, a lens 1303, a display 1308, a shutter button 1312, and a strobe 1318. In particular, a memory card 1331 may be inserted into the slot 1308. The memory card 1331 may include one or more nonvolatile memory devices 1207 according to embodiments of the present inventive concept.

If the memory card 1331 is of a contact type, it electrically contacts a specified electrical circuit on a circuit board when it is inserted into the slot 1302. If the memory card 1331 is of a non-contact type, it communicates with the memory card 1331 using a wireless signal.

Figure 18:
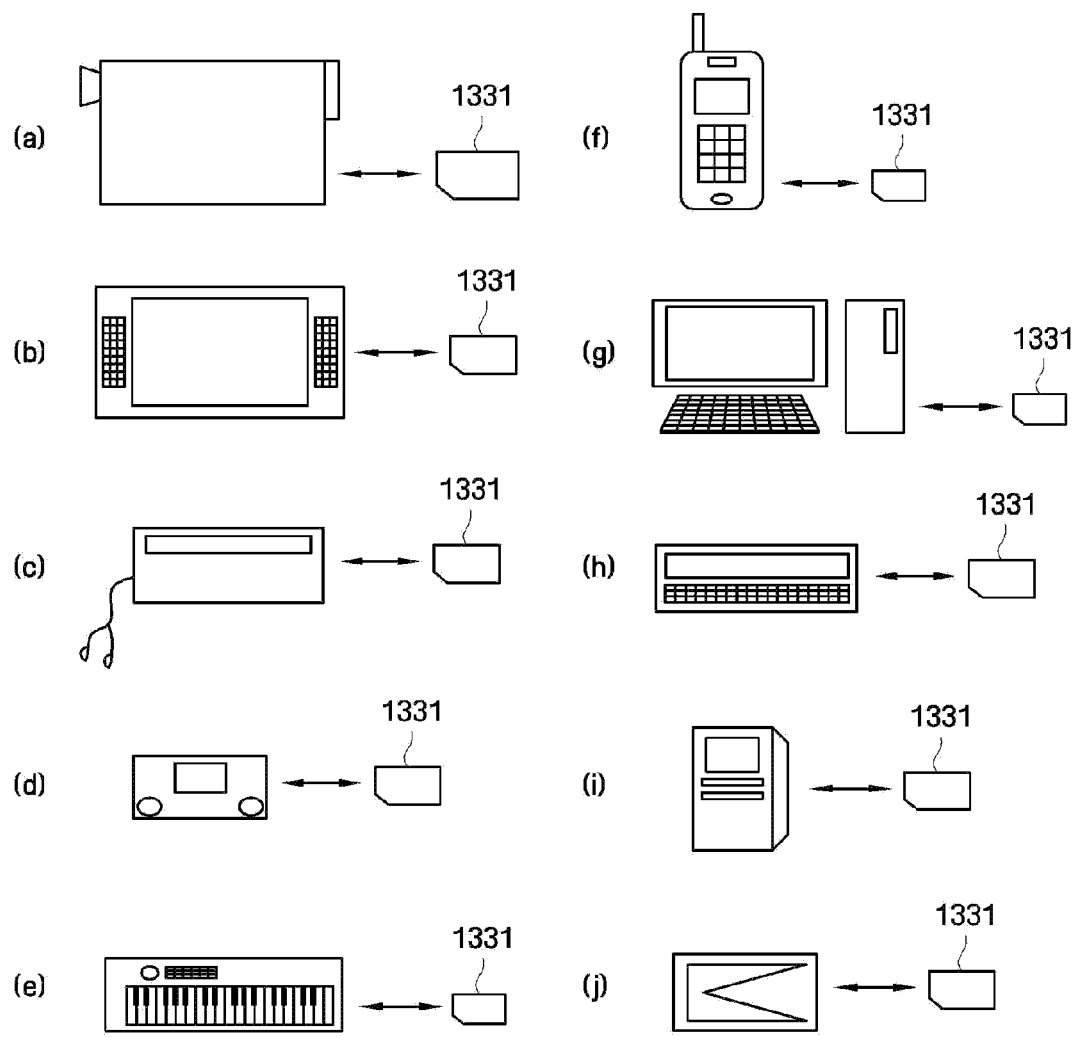

FIG. 18 is a diagram illustrating various systems which use the memory card of FIG. 16.

Referring to FIG. 18, a memory card 1331 may be used in (a) a video camera, (b) a television, (c) an audio device, (d) a game device, (e) an electronic music device, (f) a mobile phone, (g) a computer, (h) a personal digital assistant (PDA), (i) a voice recorder, (j) a personal computer (PC) card, or the like.

Figure 19:
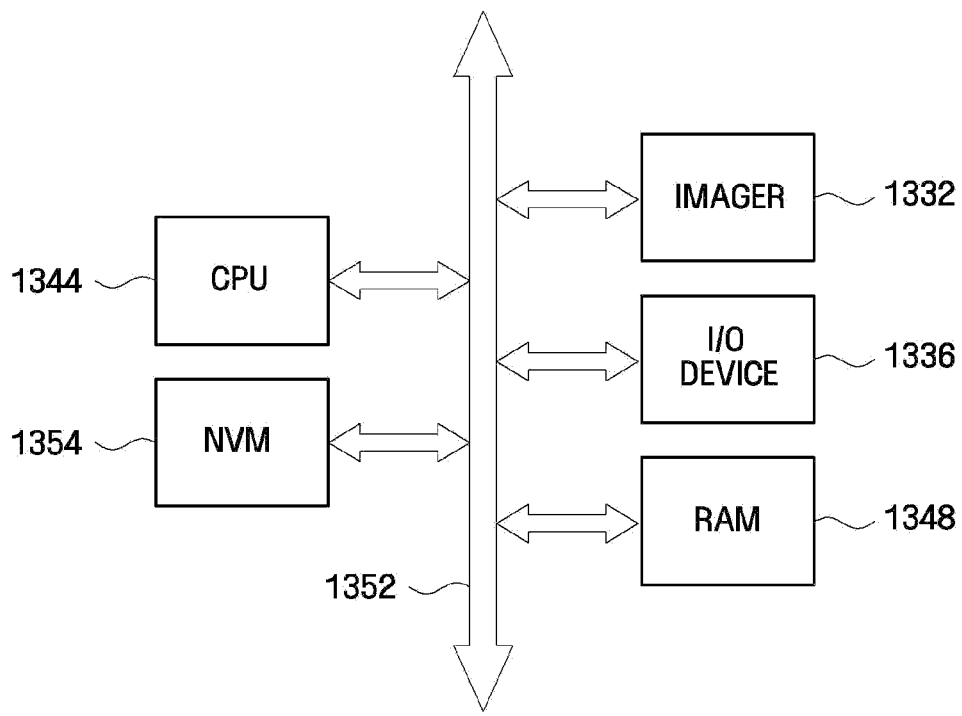

FIG. 19 is a diagram illustrating an image sensor system which uses nonvolatile memory devices according to embodiments of the present inventive concept.

Referring to FIG. 19, the image sensor system may include an imager 1332, an input/output device 1336, a random access memory (RAM) 1348, a central processing unit (CPU) 1344, and a nonvolatile memory device 1354 according to embodiments of the present inventive concept. These components, i.e., the imager 1332, the input/output device 1336, the RAM 1348, the CPU 1344, and the nonvolatile memory device 1354 communicate with each other using a bus 1352. The imager 1332 may include a photo sensing element such as a photogate or a photodiode. Each of the above components and a processor may be implemented as a single chip or separate chips.

Figure 20:
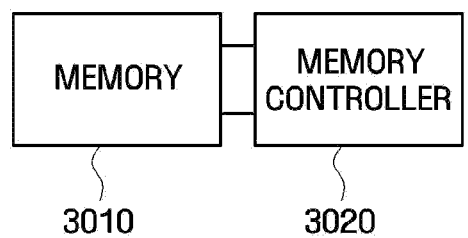
FIG. 20 is a block diagram of a memory system according to embodiments of the present inventive concept.

FIG. 20 is a block diagram of an exemplary memory system which uses nonvolatile memory devices according to embodiments of the present inventive concept.

Referring to FIG. 20, a memory 3010 is coupled to a memory controller 3020. The memory 3010 may be any of the nonvolatile memory device embodiments described above. The memory controller 3020 provides input signals for controlling an operation of the memory 3010. For example, the memory controller 3020 can provide command CMD and address signals. The memory controller 3020 may include a memory interface, a host interface, an error correction code (ECC) circuit, a CPU, and a buffer memory. The memory interface provides data transmitted from the buffer memory to the memory 3010 or transmits data read out of the memory 3010 to the buffer memory. Also, the memory interface may provide a command or an address transmitted from an external host to the memory 3010.

The host interface may communicate with an external host through a universal serial bus (USB), small computer system interface (SCSI), peripheral component interconnect (PCI) express, AT attachment (ATA), parallel ATA (PATA), serial ATA (SATA), or serial attached SCSI (SAS) interface, for example.

A memory system according to embodiments of the present inventive concept may include an ECC circuit, which generates a parity bit using data transmitted to the memory 3010. The generated parity bit may be stored in a specific area of the memory 3010, together with the data. The ECC circuit detects an error of data read out of the memory 3010. If the detected error is within a correction range, the ECC circuit corrects the detected error.

The CPU controls the external host or the memory 3010 through the host interface or the memory interface. The CPU may control write, read, and erase operations depending on firmware for driving a memory.

The buffer memory temporarily stores write data provided from an external source or data read out of the memory 3010. Also, the buffer memory may store meta data or cache data to be stored in the memory 3010. During a sudden power-off operation, the meta data or the cache data stored in the buffer memory may be stored in the memory 3010. The buffer memory may be a dynamic random access memory (DRAM) or an SRAM.

Figure 21:
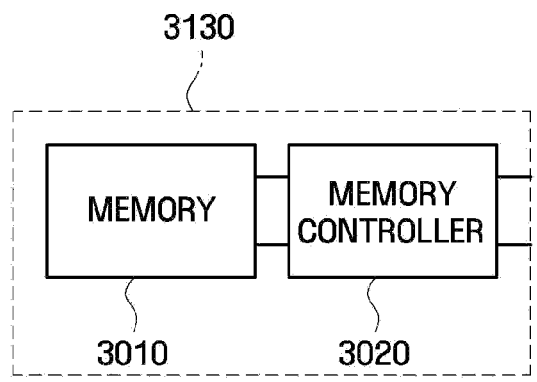
FIG. 21 is a block diagram of a memory system according to other embodiments of the present inventive concept.

FIG. 21 is a block diagram of another exemplary memory system which uses nonvolatile memory devices according to embodiments of the present inventive concept. This memory system is substantially the same as the memory system of FIG. 20, except that a memory 3010 and a memory controller 3020 are embedded in a card 3130. For example, card 3130 may include a flash memory card. Namely, the card 3130 may include a card meeting any industry standard for use with a consumer electronics device such as a digital camera, personal computer, etc. The memory controller 3020 may control the memory 3010 based on control signals received by the card 3130 from another (e.g., external) device.

Figure 22:
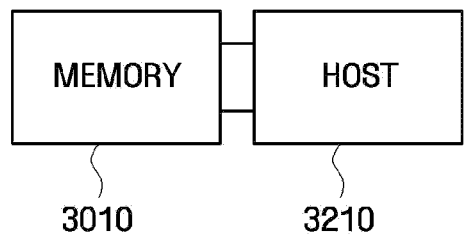
FIG. 22 is a block diagram of a memory system according to other embodiments of the present inventive concept.

FIG. 22 is a block diagram of another exemplary memory system which uses nonvolatile memory devices according to embodiments of the present inventive concept. Referring to FIG. 22, a memory 3010 may be coupled to a host system 3210. The host system 3210 may be a processing system such as a personal computer, digital camera, etc. The host system 3210 may use the memory 3010 as an erasable storage medium. As described above, the host system 3210 provides input signals for controlling operation of the memory 3010. For example, the host system 3210 can provide command CMD and address signals.

Figure 23:
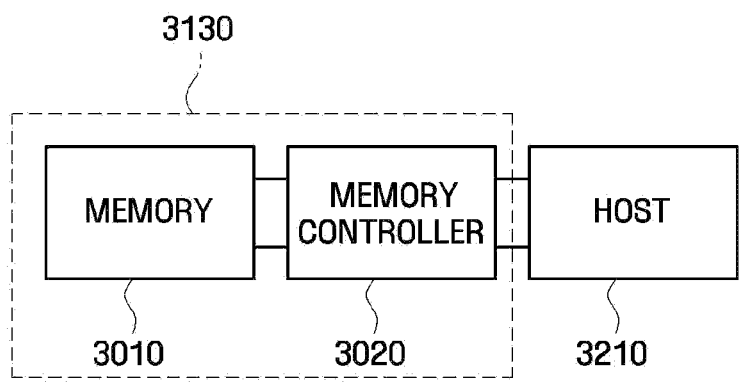
FIG. 23 is a block diagram of a memory system according to other embodiments of the present inventive concept.

FIG. 23 is a block diagram of another exemplary memory system which uses nonvolatile memory devices according to embodiments of the present inventive concept. Referring to FIG. 23, a host system 3210 is coupled to a card 3130. In this embodiment, the host system 3210 transmits control signals to the card 3130 such that the memory controller 3020 controls operation of a memory 3010.

Figure 24:
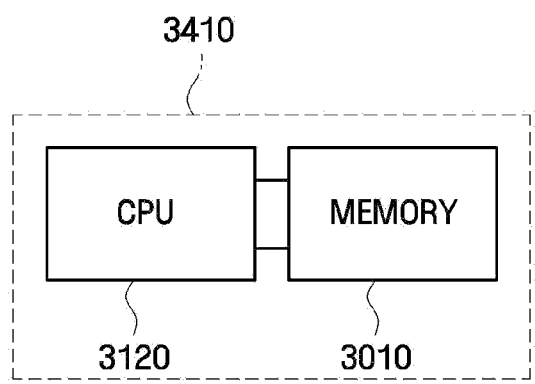
FIG. 24 is a block diagram of a memory system according to other embodiments of the present inventive concept.

FIG. 24 is a block diagram of another exemplary memory system which uses nonvolatile memory devices according to embodiments of the present inventive concept. Referring to FIG. 24, a memory 3010 is connected to a CPU 3120 within a computer system 3410. For example, the computer system 3410 may be a personal computer, PDA, etc. The memory 3010 may be directly connected with the CPU 3120, or connected via a bus, etc.

A nonvolatile memory device according to embodiments of the present inventive concept may be used as a storage class memory (SCM), which is the general category of memories capable of simultaneously providing nonvolatile characteristics and access characteristics. The SCM may be utilized as not only a data storage space but also a program performing space.

The above-described nonvolatile memory devices using resistance materials, such as PRAM, RRAM and MRAM, may be appropriate examples of an SCM. Such an SCM may be used as not only a data storage memory instead of a flash memory but also a main memory instead of an SRAM. Moreover, one SCM may be used instead of a flash memory and an SRAM.

Figure 25:
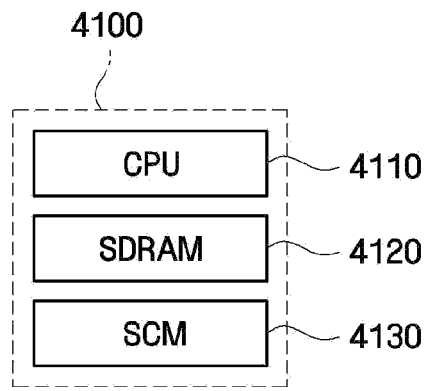
FIG. 25 is a block diagram of a memory system according to other embodiments of the present inventive concept.

FIG. 25 is a block diagram of a memory system 4100 which uses an SCM. Referring to FIG. 25, the memory system 4100 includes a CPU 4110, a synchronous DRAM (SDRAM) 4120, and an SCM 4130 used instead of a flash memory.

In the memory system 4100, data access speed of the SCM 4130 may be greater than that of a flash memory. For example, under a PC environment where the CPU 4110 runs at 4 GHz, data access speed of a PRAM which is a kind of the SCM 4130 may be about 32 times greater than that of a flash memory. Thus, the memory system 4100 equipped with the SCM 4130 may attain a higher-speed access gain than a memory system equipped with a flash memory.

Figure 26:
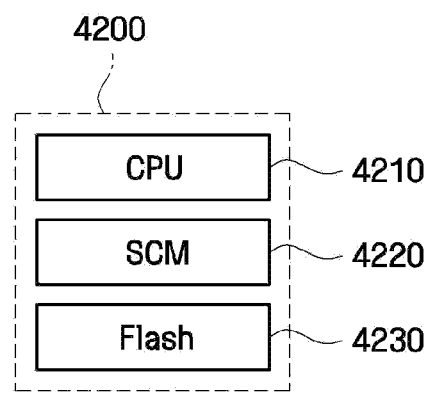
FIG. 26 is a block diagram of a memory system according to other embodiments of the present inventive concept.

FIG. 26 is a block diagram of another exemplary memory system 4200 which uses an SCM. Referring to FIG. 26, the memory system 4200 includes a CPU 4210, an SCM 4220 used instead of an SDRAM, and a flash memory 4230.

In the memory system 4200, power dissipation of the SCM 4220 is less than that of an SDRAM. Energy dissipated by the main memory of a computer system may amount to about 40 percent of total energy. Therefore, many efforts have been intensively made to reduce power dissipation of the main memory. An SCM may reduce dynamic energy dissipation by an average of as much as about 53 percent and reduce energy dissipation caused by power leakage by an average of as much as about 73 percent.

As a result, the memory system 4200 equipped with SCM 4220 may allow power dissipation to be reduced compared to a memory system equipped with an SDRAM.

Figure 27:
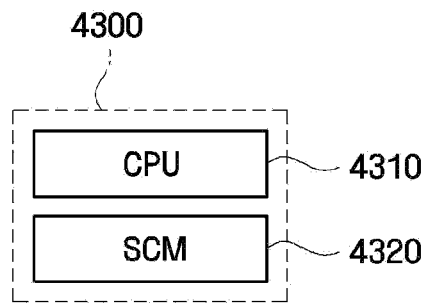
FIG. 27 is a block diagram of a memory system according to other embodiments of the present inventive concept.

FIG. 27 is a block diagram of another exemplary memory system 4300 which uses an SCM. Referring to FIG. 27, the memory system 4300 includes a CPU 4310 and an SCM 4320. The SCM 4320 is used as a main memory instead of an SDRAM and as a data storage memory instead of a flash memory. The memory system 4300 can be advantageous with respect to data access speed, low power, space utilization, and cost.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A nonvolatile memory device comprising:
   a resistive memory cell which stores multiple bits;
   a sensing node, wherein a cell current flows from the sensing node through the resistive memory cell;
   a clamping unit coupled between the resistive memory cell and the sensing node, the clamping unit providing a clamping bias to the resistive memory cell, wherein the clamping bias varies over time;
   a compensation unit which provides a compensation current to the sensing node, wherein the compensation current is constant during a read period;
   a sense amplifier coupled to the sensing node, the sense amplifier sensing a change in a level of the sensing node at a period of time when the cell current is equal to the compensation current; and
   an encoder which codes an output value of the sense amplifier in response to a first clock signal.

2. The nonvolatile memory device of claim 1, wherein the clamping bias increases over time.

3. The nonvolatile memory device of claim 2, wherein the clamping bias increases over time in the form of a k-th function, where k is a natural number.

4. The nonvolatile memory device of claim 2, wherein the clamping bias increases over time in a stepped manner.

5. The nonvolatile memory device of claim 1, wherein if first data is stored in the resistive memory cell, then the output value of the sense amplifier transitions after a first period of time from when the clamping bias begins to be provided, and if second data, which is different from the first data, is stored in the resistive memory cell, then the output value of the sense amplifier transitions after a second period of time, which is different from the first period of time, from when the clamping bias begins to be provided.

6. The nonvolatile memory device of claim 1, wherein during the read period, the sense amplifier is enabled multiple times in response to a second clock signal.

7. The nonvolatile memory device of claim 1, wherein the compensation unit controls a time when the sense amplifier is enabled by adjusting a magnitude of the compensation current.

8. The nonvolatile memory device of claim 1, wherein a memory cell array comprises the resistive memory cell, the memory cell array having a cross-point structure.

9. A nonvolatile memory device comprising:
a resistive memory cell which stores multiple bits;
a sensing node, wherein a cell current flows from the sensing node through the resistive memory cell;
a clamping unit coupled between the resistive memory cell and the sensing node and provides a clamping bias to the resistive memory cell, wherein the clamping bias varies over time;
a compensation unit which provides a compensation current to the sensing node, wherein the compensation current is constant during a read period; and
a sense amplifier which is connected to the sensing node and senses a change in a level of the sensing node in response to a clock signal at a period of time when the cell current is equal to the compensation current.

10. The nonvolatile memory device of claim 9, wherein the clamping bias increases over time.

11. The nonvolatile memory device of claim 10, wherein the clamping bias increases over time in the form of a k-th function, where k is a natural number.

12. The nonvolatile memory device of claim 10, wherein the clamping bias increases over time in a stepped fashion.

13. The nonvolatile memory device of claim 9, wherein if first data is stored in the resistive memory cell, then the output value of the sense amplifier transitions after a first period of time from when the clamping bias begins to be provided, and if second data, which is different from the first data, is stored in the resistive memory cell, then the output value of the sense amplifier transitions after a second period of time, which is different from the first period of time, from when the clamping bias begins to be provided.

14. The nonvolatile memory device of claim 9, wherein the compensation unit controls a time when the sense amplifier is enabled by adjusting the magnitude of the compensation current.

15. The nonvolatile memory device of claim 9, wherein a memory cell array comprising the resistive memory cell has a cross-point structure.

16. A nonvolatile memory device comprising:
a resistive memory cell;
a compensation unit;
a sensing node coupled between the compensation unit and the resistive memory cell, the compensation unit providing a compensation current to the sensing node, wherein a cell current flows from the sensing node through the resistive memory cell;
a clamping unit coupled between the resistive memory cell and the sensing node, the clamping unit providing a clamping bias to the resistive memory cell, wherein the clamping bias varies over time; and
a sense amplifier coupled to the sensing node, the sense amplifier sensing a change in a level of the sensing node related to the compensation current at a period of time when the cell current is equal to the compensation current, compares the level of the sensing node to a reference value, and generates an output value in response to the comparison, wherein the output value transitions, according to a state of data stored in the resistive memory cell after the period of time.

17. The nonvolatile memory device of claim 16, further comprising an encoder which codes the output value in response to a clock signal.

18. The nonvolatile memory device of claim 16, wherein the clamping bias increases over time.

19. The nonvolatile memory device of claim 16, wherein if first data is stored in the resistive memory cell, then the output value of the sense amplifier transitions after a first period of time from when the clamping bias begins to be provided, and if second data, which is different from the first data, is stored in the resistive memory cell, then the output value of the sense amplifier transitions after a second period of time, which is different from the first period of time, from when the clamping bias begins to be provided.

20. The nonvolatile memory device of claim 16, wherein the compensation unit controls a time when the sense amplifier is enabled by adjusting the magnitude of the compensation current.

* * * * *